United States Patent [19]

Osaka et al.

[11] 4,363,003
[45] Dec. 7, 1982

[54] PHASE LOCKED LOOP FOR USE WITH DISCONTINUOUS INPUT SIGNALS

[75] Inventors: Hiroshi Osaka; Akira Honma; Yoshio Kizaki, all of Toda, Japan

[73] Assignee: Clarion Co., Ltd., Tokyo, Japan

[21] Appl. No.: 214,607

[22] Filed: Dec. 9, 1980

[30] Foreign Application Priority Data

Dec. 29, 1979 [JP] Japan .................. 54-173101

[51] Int. Cl.$^3$ .............................................. H03L 7/08
[52] U.S. Cl. ..................................... 331/1 A; 331/25
[58] Field of Search ................... 331/1 A, 14, 18, 23, 331/25, 27

[56] References Cited

U.S. PATENT DOCUMENTS 3,697,884 10/1972 Fort et al. ..................... 331/1 A
4,017,806 4/1977 Rogers ......................... 331/1 A
4,310,805 1/1982 Hackert et al. .................. 331/1 A Primary Examiner—Siegfried H. Grimm
Attorney, Agent, or Firm—Flynn, Thiel, Boutell & Tanis

[57] ABSTRACT

A PLL circuit which comprises a phase comparator, a voltage-controlled oscillator whose oscillation frequency is controlled by an output from the phase comparator, a flip-flop circuit adapted to be set by an input signal, and a counter circuit responsive to an output condition of the flip-flop circuit to count an output from the voltage-controlled oscillator. The flip-flop circuit is adapted to be reset by an output from the counter circuit, and the phase comparator is adapted to receive an output from the flip-flop circuit and the output from the voltage-controlled oscillator.

4 Claims, 4 Drawing Figures

PHASE LOCKED LOOP FOR USE WITH DISCONTINUOUS INPUT SIGNALS

BACKGROUND OF THE INVENTION

1. Field of the Invention

This invention generally relates to a PLL (phase-locked loop) circuit, and more particularly to an improvement in the PLL circuit which is capable of generating a continuous-wave signal having regular periods from a discontinuous input signal having irregular periods and yet capable of being manufactured at a reasonable cost.

2. Description of the Prior Art

As widely known, a PLL circuit is used to generate a signal synchronized with a reference input signal and having a frequency integral multiple of that of the reference input signal. The known PLL circuit, generally, has an arrangement, for example, as illustrated in FIG. 1. In the figure, 1 is an input terminal, 2 is a voltage-controlled oscillator, 3 is a frequency divider, 4 is a phase comparator, 5 is a low pass filter and 6 is an output terminal. A reference input signal supplied to the input terminal 1 is provided to one input of the phase comparator 4 and an output from the frequency divider 3 is provided to another input of the phase comparator 4. The frequency divider 3 divides a frequency of an output signal from the voltage-controlled oscillator 2 into an integral submultiple of the signal.

The phase comparator 4 generates an output voltage proportional to a phase difference between the two signals provided to the phase comparator 4. This voltage is applied to a control terminal of the voltage-controlled oscillator 2. The phase comparator 4 operates to control an oscillation frequency of the voltage-controlled oscillator so as to reduce the phase difference between the two signals provided to the comparator 4 when the phase difference is increased. Therefore, the PLL circuit of FIG. 1 keeps a constant phase difference and is held in equilibrium, so that a signal in synchronism with the reference input signal and having a frequency integral multiple of the frequency of the input signal can be obtained at the output terminal 6.

As can be noted, the conventional PLL circuit has such a disadvantage that it possibly malfunctions when a noise interferes with the reference input signal or the period of the reference input singal is not continuous.

By this reason, a circuit as illustrated in FIG. 2 has been proposed to generate a signal of regular period from a signal of discontinuous period. In the figure, 8 is a monostable-multivibrator having no re-triggerable function. A signal supplied to an input terminal 7 triggers the monostable multivibrator 8 and an output appears during a time constant determined by a resistor 10 and a capacitor 11. Therefore, when the time constant is selected to be somewhat shorter than the period of the reference input signal, the monostable multivibrator 8 is not triggered upon application of an input to the input terminal 7 during a time when the multivibrator 8 produces its output. Thus, a signal having a desired period can be obtained.

However, in this circuit, the pulse duration of the output from the monostable mulitvibrator is unstable due to a change with temperature or age, and it is difficult to maintain the stability for a long time. Although a counter may be employed to obtain a stable output pulse duration, it necessitates employment of an oscillator which is highly stable but expensive and renders the formation of the circuit complicated and the cost for manufacturing the same increased.

OBJECT OF THE PRESENT INVENTION

It is therefore an object of the present invention to provide an improved PLL circuit which is capable of obviating the disadvantages involved in the conventional PLL circuit.

It is another object of the present invention to provide an improved PLL circuit which is capable of ensuring high stability, free from affection of noises, and manufactured at a reasonable cost.

SUMMARY OF THE INVENTION

In accordance with the present invention, there is provided a PLL circit which comprises a phase comparator circuit; a voltage-controlled oscillator circuit whose oscillation frequency is controlled by an output from said phase comparator circuit; a counter circuit for counting an oscillation output from said voltage-controlled oscillator circuit; and a control means responsive to an input signal to provide the oscillation output of the voltage-controlled oscillator circuit to said counter circuit and to stop, by a count output from said counter circuit, the provision of said oscillation output, said phase comparator circuit being adapted to compare a phase of an output from said control means produced in response to said input signal with that of the oscillation output from said voltage-controlled oscillator circuit.

DESCRIPTION OF THE INVENTION

Figure 1:
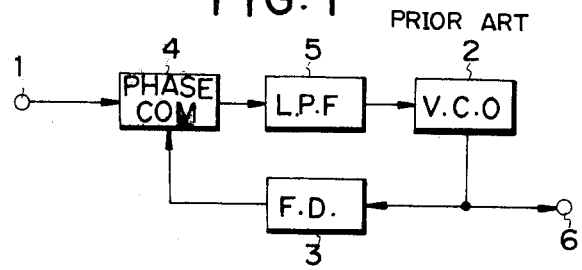
FIG. 1 is a block diagram showing a principle of a conventional PLL circuit.
Figure 2:
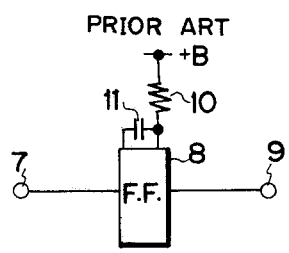
FIG. 2 is a diagram of a conventional circuit for obtaining a constant-period signal.
Figure 3:
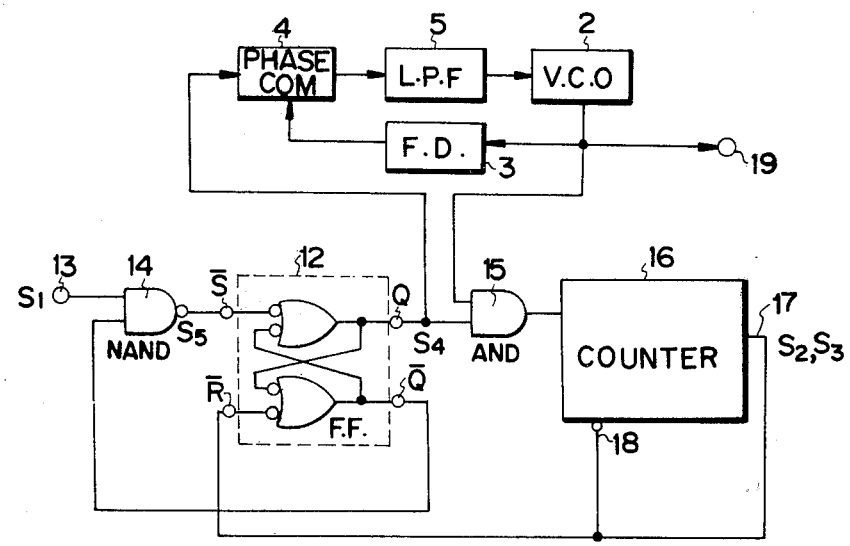
FIG. 3 is a block diagram of one embodiment of a PLL circuit according to the present invention.
Figure 4:
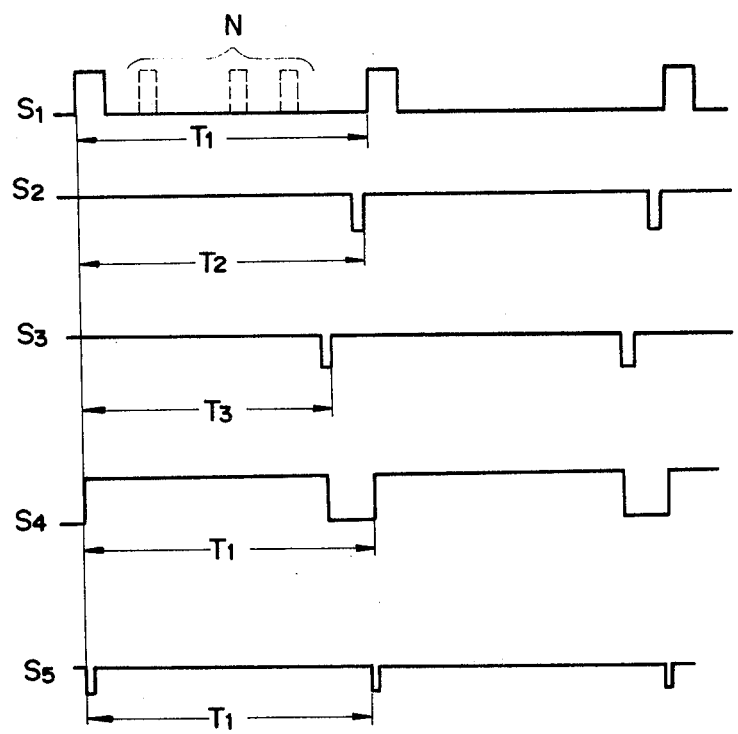
FIG. 4 is a timing chart showing operations of various portions of the PLL circuit illustrated in FIG. 3.

Referring now to FIGS. 3 and 4, there is illustrated one embodiment of the present invention. In FIG. 3, the same or similar numerals as or to those in FIG. 1 indicate the same or similar circuits as or to those in FIG. 1. 12 is a flip-flop circuit, 13 is an input terminal, 14 is a NAND circuit, 15 is an AND circuit, 16 is a counter circuit, 17 and 18 are an output terminal and a clear terminal of the counter circuit 16, respectively, and 19 is an output terminal.

The flip-flop circuit 12 is one example of means for controlling the supply of a counting input to the counter circuit 16 and has a set input terminal $\bar{S}$, a reset input terminal $\bar{R}$, and output terminals $\bar{Q}$ and Q. If, in an initial state, the output terminal Q is at a low level and the output terminal $\bar{Q}$ is at a high level, and when a high level signal is supplied to the input terminal 13 and applied to the flip-flop circuit through the NAND gate circuit 14, the set terminal $\bar{S}$ is triggered so that a high level signal appears at the output terminal Q and a low level signal appears at the output terminal $\bar{Q}$. As a result, an output from the voltage-controlled oscillator 2 is supplied to the counter circuit 16 through the AND circuit 15 to trigger the counter 16, and the output from the NAND gate 14 is inhibited. The counter circuit 16 counts up the output from the voltage-controlled oscillator 2 until the count reaches a preset value (counting limit) and produces a signal at its output terminal 17. This signal triggers the clear terminal 18 of the counter circuit 16 to clear the counter circuit 16 and further triggers the reset terminal $\overline{R}$ of the flip-flop circuit 12. As a result, a low level signal appears at the output terminal Q of the flip-flop circuit 12 and a high level signal appears at the output terminal $\overline{Q}$ thereof. Thus, the flip-flop circuit 12 is reset to its original state.

The timing of the operation as described above is as shown in FIG. 4. In the figure, $S_1$ is an input signal, $S_2$ and $S_3$ are outputs from the counter circuit 16, $S_4$ is an output appearing at the output terminal Q of the flip-flop circuit 12 and $S_5$ is an output of the NAND gate 14.

The counter circuit 16 is preset so that a period $T_2$ of the output signal $S_2$ from the counter circuit 16 at the time of minimum frequency required for operating the voltage-controlled oscillator 2 may be shorter than a period $T_1$ of the input signal $S_1$. A period $T_3$ of the output signal $S_3$ from the counter circuit 16 at the time of maximum frequency for operating the voltage-controlled oscillator 2 is shorter than the period $T_2$. As described above, when the signal $S_1$ is inputted to the input terminal 13, the output from the NAND gate 14 is inhibited during a time when the signal $S_3$ appears at the output terminal 17 of the counter circuit 16, i.e., during the period $T_3$. Therefore, if a noise N interferes with the input signal $S_1$ as shown by a broken line in FIG. 4 or the period $T_1$ of the input signal $S_1$ is discontinuous, the flip-flop circuit 12 is not triggered, and the continuous-wave signal $S_4$ having a period equal to the period $T_1$ of the input signal appears at the output terminal Q of the flip-flop circuit 12.

When the signal $S_4$ appearing at the output terminal Q of the flip-flop circuit 12 is used as the reference input signal to the phase comparator 4, the PLL circuit operates properly, and a signal synchronized, in phase, with the signal $S_1$ applied to the input terminal 13 appears at the output terminal 19.

The output $S_5$ from the NAND gae 14 also has a period equal to that of the input signal $S_1$ as apparent from FIG. 4, so taht it may also be used as the reference input signal to the phase comparator 4.

Although the frequency divider 3 is used in the PLL circuit in the present invention and the signal obtained at the output terminal 19 has a frequency integral mutiple of that of the input signal to the input terminal 13, the frequency divider is not required when a signal having a frequency equal to that of the input signal is desired.

As described above, in accordance with the present invention, the voltage-controlled oscillator in the PLL circuit may commonly be used as a clock source for the counter circuit, so that possible malfunction due to a noise interfering with the input signal or discontinuity of the period of the input signal may be prevented, and the circuit may be formed in a simple structure at a reasonable cost.

We claim:

1. A PLL circuit which comprises a phase comparator circuit; a voltage-controlled oscillator circuit whose oscillation frequency is controlled by an output from said phase comparator circuit; a counter circuit for counting an oscillation ouptut from said voltage-controlled oscillator circuit; and a control means responsive to an input signal to provide the oscillation output of the voltage-controlled oscillator circuit to said counter circuit and to stop, by a count output from said counter circuit, the provision of said oscillation output, said phase comparator circuit being adapted to compare a phase of an output from said control means produced in response to said input signal with that of the oscillation output from said voltage-controlled oscillator circuit.

2. A PLL circuit according to claim 1, wherein said control means is formed of a flip-flop circuit which is adapted to be set in response to said input signal and reset by said count output from the counter circuit.

3. A PLL circuit according to claim 1, wherein said control means is formed of a NAND circuit and a flip-flop circuit, said flip-flop circuit is adapted to be set by said input signal supplied thereto through said NAND gate and reset by the count output from said counter circuit, and an inversion output from said flip-flop circuit is provided to said NAND circuit.

4. A PLL circuit according to claim 1, wherein a count limit of said counter circuit is set so that the period of the count output from said counter circuit at the time of minimum frequency of said voltage-controlled oscillator is shorter than the period of said input signal.

* * * * *